United States Patent
Lee et al.

(10) Patent No.: US 9,882,056 B2
(45) Date of Patent: Jan. 30, 2018

(54) THIN FILM TRANSISTOR AND METHOD OF MANUFACTURING THE SAME

(71) Applicant: Samsung Display Co., Ltd., Yongin-si (KR)

(72) Inventors: Yong-Su Lee, Hwaseong-si (KR); Yoon-Ho Khang, Yongin-si (KR); Se-Hwan Yu, Seoul (KR); Su-Hyoung Kang, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 124 days.

(21) Appl. No.: 14/939,564

(22) Filed: Nov. 12, 2015

(65) Prior Publication Data

US 2016/0064571 A1    Mar. 3, 2016

Related U.S. Application Data

(63) Continuation of application No. 13/418,172, filed on Mar. 12, 2012, now abandoned.

(30) Foreign Application Priority Data

Jun. 28, 2011   (KR) .................. 10-2011-0062865

(51) Int. Cl.
*H01L 29/786* (2006.01)
*H01L 29/43* (2006.01)
(Continued)

(52) U.S. Cl.
CPC .. *H01L 29/78642* (2013.01); *H01L 29/41733* (2013.01); *H01L 29/41741* (2013.01);
(Continued)

(58) Field of Classification Search
CPC ......... H01L 29/41733; H01L 29/41741; H01L 29/6675; H01L 29/66666; H01L 29/78642; H01L 29/7869; H01L 29/78693
See application file for complete search history.

(56) References Cited

U.S. PATENT DOCUMENTS 4,547,789 A    10/1985   Cannella et al.
4,620,208 A *  10/1986   Fritzsche .......... H01L 29/78642
                                                           257/58

(Continued)

FOREIGN PATENT DOCUMENTS

JP    2008-205272    9/2008
JP    2011-091364    5/2011
WO    2011/046655    4/2011

OTHER PUBLICATIONS

Final Office Action dated Jun. 12, 2015, in U.S. Appl. No. 13/418,172.
(Continued)

*Primary Examiner* — Robert Bachner
*Assistant Examiner* — Molly Reida
(74) *Attorney, Agent, or Firm* — H.C. Park & Associates, PLC

(57) ABSTRACT

A thin film transistor including a gate electrode, a semiconductor layer, a gate insulating layer, a source electrode, a drain electrode and a graphene pattern. The semiconductor layer overlaps with the gate electrode. The gate insulating layer is disposed between the gate electrode and the semiconductor layer. The source electrode overlaps with the semiconductor layer. The drain electrode overlaps with the semiconductor layer. The drain electrode is spaced apart from the source electrode. The graphene pattern is disposed between the semiconductor layer and at least one of the source electrode and the drain electrode.

11 Claims, 9 Drawing Sheets

(51) Int. Cl.
    *H01L 29/66*     (2006.01)
    *H01L 29/417*    (2006.01)
    *H01L 29/45*     (2006.01)

(52) U.S. Cl.
    CPC ........ *H01L 29/41775* (2013.01); *H01L 29/45* (2013.01); *H01L 29/6675* (2013.01); *H01L 29/66666* (2013.01); *H01L 29/7869* (2013.01); *H01L 29/78606* (2013.01)

(56) References Cited

U.S. PATENT DOCUMENTS

| 6,255,706 | B1 | 7/2001 | Watanabe et al. |
| 8,558,382 | B2 | 10/2013 | Maeda et al. |
| 2002/0001887 | A1 | 1/2002 | Sung et al. |
| 2007/0045734 | A1 | 3/2007 | Wu et al. |
| 2007/0102818 | A1* | 5/2007 | Sasaki ............... G02F 1/136286 257/751 |
| 2010/0323113 | A1 | 12/2010 | Ramappa et al. |
| 2011/0012118 | A1 | 1/2011 | Yamazaki et al. |
| 2012/0139114 | A1 | 6/2012 | Zhang et al. |
| 2012/0141799 | A1 | 6/2012 | Kub et al. |
| 2012/0168724 | A1 | 7/2012 | Park et al. |
| 2012/0188478 | A1 | 7/2012 | Kuwabara |

OTHER PUBLICATIONS

Non-Final Office Action dated Dec. 3, 2014, in U.S. Appl. No. 13/418,172.
Final Office Action dated Mar. 28, 2014, in U.S. Appl. No. 13/418,172.
Non-Final Office Action dated Dec. 6, 2013, in U.S. Appl. No. 13/418,172.
Non-Final Office Action dated Jun. 25, 2013, in U.S. Appl. No. 13/418,172.
Chong-an Di et al., "Patterned Graphene as Source/Drain Electrodes for Bottom-Contact Organic Field-Effect Transistors", Advanced Materials 2008, 20, 2008 Wiley-VCH Verlag GmbH&Co. KGaA, Weinheim, pp. 3298-3293.

* cited by examiner

THIN FILM TRANSISTOR AND METHOD OF MANUFACTURING THE SAME

CROSS-REFERENCE TO RELATED APPLICATION

This application is a continuation of U.S. patent application Ser. No. 13/418,172, filed on Mar. 12, 2012, and claims the benefit of and priority to Korean Patent Application No. 10-2011-0062865, filed on Jun. 28, 2011, each of which is hereby incorporated by reference for all purposes as if fully set forth herein.

BACKGROUND OF THE INVENTION

Field of the Invention

Exemplary embodiments of the present invention relate to a thin film transistor and a method of manufacturing the thin film transistor. More particularly, exemplary embodiments of the present invention relate to a thin film transistor having improved electrical stability and a method of manufacturing the thin film transistor.

Description of the Background

Generally, a display apparatus includes an array substrate including a switching element and an opposite substrate facing the array substrate. The switching element includes a gate electrode electrically connected to a gate line, a semiconductor layer insulated from the gate electrode, a source electrode electrically connected to a data line and the semiconductor layer, and a drain electrode spaced apart from the source electrode and electrically connected to the semiconductor layer.

For example, the types of switching elements for the display apparatus may be divided into an amorphous silicon thin film transistor ("TFT"), a poly silicon TFT, and an oxide semiconductor TFT.

The amorphous silicon TFT is uniformly formed on a large substrate in a low manufacturing cost. However, the amorphous silicon TFT has a relatively low charge carrier mobility. The poly silicon TFT has a charge carrier mobility higher than the amorphous silicon TFT, and a deterioration of a characteristic of the poly silicon TFT is less than the amorphous silicon TFT. However, a process of manufacturing the poly silicon TFT is complicated so that a manufacturing cost is high. The oxide semiconductor TFT may be manufactured in a low temperature process, may be formed in a large area, and may have a relatively high charge carrier mobility.

In a process of manufacturing the switching element, when the source electrode and the drain electrode react with the semiconductor layer, a conductive characteristic of the semiconductor layer may be changed. In addition, when the oxide semiconductor reacts with the source electrode and the drain electrode, a cation included in the oxide semiconductor may be deposited so that a wiring resistance may increase. Thus, the electrical stability and reliability of the switching element may decrease.

In addition, when the source electrode and the drain electrode react with an insulating layer or a passivation layer, the insulating layer or a passivation layer may be lifted off from the source electrode and the drain electrode. Particularly, when the insulating layer or the passivation layer of the oxide silicon TFT includes an oxide silicon, the insulating layer or the passivation layer may be lifted off more frequently and more seriously.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a thin film transistor ("TFT") capable of improving an electrical stability and a reliability using a graphene pattern.

Exemplary embodiments of the present invention also provide a method of manufacturing the TFT.

In an exemplary embodiment of a TFT according to the present invention, the TFT includes a gate electrode, a semiconductor layer, a gate insulating layer, a source electrode, a drain electrode and a graphene pattern. The semiconductor layer overlaps with the gate electrode. The gate insulating layer is disposed between the gate electrode and the semiconductor layer. The source electrode overlaps with the semiconductor layer. The drain electrode overlaps with the semiconductor layer. The drain electrode is spaced apart from the source electrode. The graphene pattern is disposed between the semiconductor layer and at least one of the source electrode and the drain electrode.

In an exemplary embodiment of a method of manufacturing a TFT according to the present invention, the method includes forming a gate electrode on a base substrate, forming a gate insulating layer on the gate electrode, forming a semiconductor layer overlapping with the gate electrode on the gate insulating layer, forming a graphene layer on the semiconductor layer, forming a source electrode and a drain electrode on the graphene layer and patterning the graphene layer between the source and drain electrodes to form a graphene pattern.

In an exemplary embodiment of a method of manufacturing a TFT according to the present invention, the method includes forming a source electrode on a base substrate, forming an insulating layer on the source electrode, forming a drain electrode on the insulating layer, forming a graphene pattern on the drain electrode, forming a semiconductor layer on the graphene pattern, patterning the semiconductor layer, forming a gate insulating layer on the semiconductor layer and forming a gate electrode on the gate insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
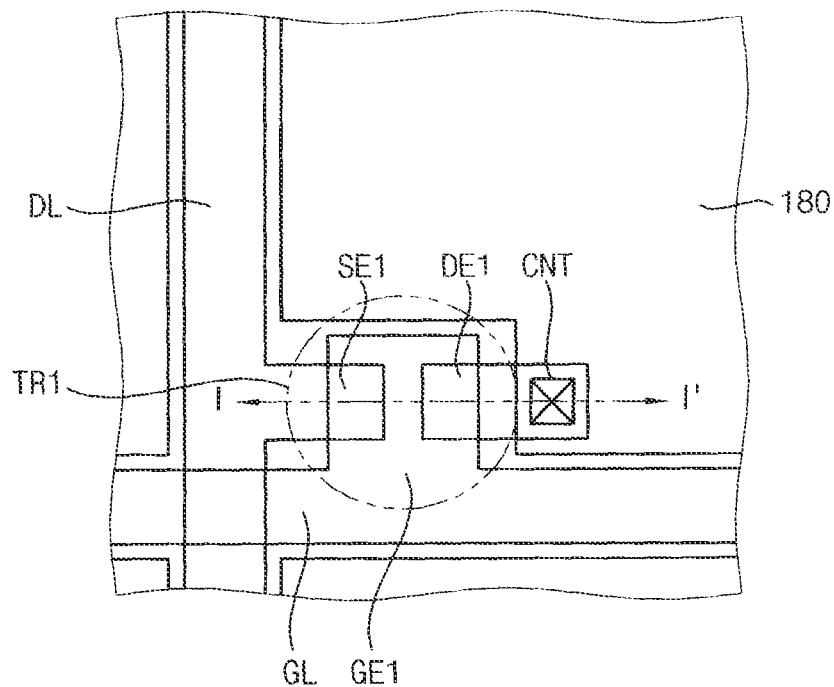
FIG. 1 is a plan view of an array substrate according to an exemplary embodiment of the present invention.

Hereinafter, exemplary embodiments of the present invention will be described in further detail with reference to the accompanying drawings. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a plan view of an array substrate according to an exemplary embodiment of the present invention.

Referring to FIG. 1, the array substrate includes a gate line GL formed on a base substrate, a data line DL, a thin film transistor ("TFT") TR1 and a pixel electrode 180.

The gate line GL may extend in a first direction. The array substrate may include a plurality of the gate lines GL. The data line DL may extend in a second direction crossing the first direction. The array substrate may include a plurality of the data lines DL.

The TFT TR1 is electrically connected to the gate line GL and the data line DL. The TFT TR1 may be disposed in an area where the gate line GL and the data line DL cross with each other.

The TFT TR1 includes a gate electrode GE1, a source electrode SE1 and a drain electrode DE1. The gate electrode GE1 may be electrically connected to the gate line GL.

For example, the gate electrode GE1 may be formed integrally with the gate line GL. The gate electrode GE1 may be a protruded portion from the gate line GL.

The source electrode SE1 may be formed integrally with the data line DL. The source electrode SE1 may be a protruded portion from the data line DL.

Figure 2:
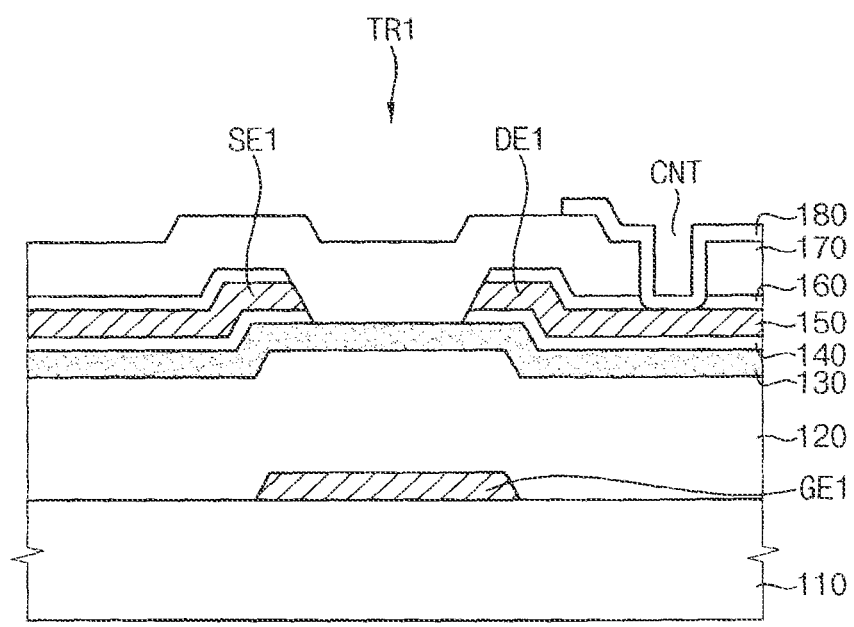
FIG. 2 is a cross-sectional view taken along a line I-I' of FIG. 1.

The TFT TR1 is explained in detail referring to FIG. 2.

The pixel electrode 180 is electrically connected to the TFT TR1. When the TFT TR1 is turned on, a data voltage applied to the data line DL is transmitted to the pixel electrode 180.

FIG. 2 is a cross-sectional view taken along line I-I' of FIG. 1.

Referring to FIGS. 1 and 2, the TFT TR1 includes the gate electrode GE1, a gate insulating layer 120, a semiconductor layer 130, a graphene pattern 140, the source electrode SE1 and the drain electrode DE1.

The gate electrode GE1 is disposed on the base substrate 110. For example, the gate electrode GE1 may include one of aluminum (Al), copper (Cu), molybdenum (Mo) and titanium Ti or an alloy thereof. For example, the gate electrode GE1 may include a transparent conductive material such as an indium tin oxide (ITO), an indium zinc oxide (IZO) and an aluminum doped zinc oxide (AZO). The present invention is not limited to a material of the gate electrode GE1.

The gate electrode GE1 may have a single layer structure. Alternatively, the gate electrode GE1 may have a multi layer structure which includes a plurality of conductive layers or at least one of conductive layers and at least one of insulating layers.

The gate insulating layer 120 is disposed on the gate electrode GE1. The gate insulating layer 120 insulates the gate line GL from the data line DL. In addition, the gate insulating layer 120 insulates the gate electrode GE1 from the semiconductor layer 130. The gate insulating layer 120 may be disposed in an entire area of the base substrate 110.

For example, the gate insulating layer 120 may include a silicon oxide (SiOx). For example, the gate insulating layer 120 may include a silicon nitride (SiNx).

The gate insulating layer 120 may have a single layer structure. Alternatively, the gate insulating layer 120 may have a multi layer structure. For example, the gate insulating layer 120 may include a first layer disposed on the gate electrode GE1 and a second layer disposed on the first layer. The first layer may include the silicon nitride (SiNx). The second layer may include the silicon oxide (SiOx).

The semiconductor layer 130 is disposed on the gate insulating layer 120. The semiconductor layer 130 overlaps with the gate electrode GE1. The semiconductor layer 130 functions as a channel layer of the TFT TR1.

The semiconductor layer 130 may include an amorphous silicon semiconductor. The semiconductor layer 130 may include an active layer and an ohmic contact layer. The active layer may include the amorphous silicon. The ohmic contact layer may include an amorphous silicon doped with a dopant.

The semiconductor layer 130 may include an oxide semiconductor. For example, the semiconductor layer 130 may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide and so on. The semiconductor layer 130 may include an oxide semiconductor doped with a metal such as aluminum (Al), nickel (Ni), copper (Cu), tantalum (Ta), molybdenum (Mo), hafnium (Hf), titanium (Ti), niobium (Nb), chromium (Cr), and tungsten (W). The present invention is not limited to a material of the oxide semiconductor.

The graphene pattern 140 is disposed on the semiconductor layer 130. The source electrode SE1 and the drain electrode DE1 are disposed on the graphene pattern 140.

The source electrode SE1 overlaps with the semiconductor layer 130. The drain electrode DE1 overlaps with the semiconductor layer 130. The drain electrode DE1 is spaced apart from the source electrode SE1.

For example, each of the source electrode SE1 and the drain electrode DE1 may include aluminum (Al), copper (Cu), molybdenum (Mo), titanium (Ti) and so on or an alloy thereof. Each of the source electrode SE1 and the drain electrode DE1 may include a transparent conductive material such as an indium tin oxide (ITO), an indium zinc oxide (IZO) and an aluminum doped zinc oxide (AZO).

Each of the source electrode SE1 and the drain electrode DE1 may include a plurality of layers. Each of the source electrode SE1 and the drain electrode DE1 may include a first electrode layer making contact with the graphene pattern 140 and a second electrode layer making contact with the first electrode layer. For example, the first electrode layer may include one of titanium (Ti), molybdenum (Mo), and an alloy thereof. The second electrode layer may include copper (Cu).

When the source electrode SE1 and the drain electrode DE1 make direct contact with the semiconductor layer 130, cations of the source electrode SE1 and the drain electrode DE1 may diffuse into the semiconductor layer 130. For example, when the source electrode SE1 and the drain electrode DE1 includes copper (Cu), a copper ion may diffuse into the semiconductor layer 130. Accordingly, a characteristic of the semiconductor layer 130 is changed so that electrical stability and reliability of the TFT TR1 may be decreased. For example, a conductivity of the semiconductor layer 130 and a threshold voltage of the semiconductor layer 130 may be changed.

In addition, a cation of the semiconductor layer 130 may be deposited at the source electrode SE1 and the drain electrode DE1. For example, when the semiconductor layer 130 includes an indium (In), the indium (In) may be deposited at the source electrode SE1 and the drain electrode DE1. Accordingly, wiring resistances of the source electrode SE1 and the drain electrode DE1 may be increased.

A portion of the graphene pattern 140 is disposed between the source electrode SE1 and the semiconductor layer 130 to prevent an interfacial reaction between the source electrode SE1 and the semiconductor layer 130. Another portion of the graphene pattern 140 is disposed between the drain electrode DE1 and the semiconductor layer 130 to prevent an interfacial reaction between the drain electrode DE1 and the semiconductor layer 130.

The graphene pattern 140 has a relatively high conductivity so that the graphene pattern 140 functions as a portion of the source electrode SE1 and the drain electrode DE1. In addition, the graphene pattern 140 functions as a barrier preventing the source electrode SE1 and the drain electrode DE1 from reacting with the semiconductor layer 130.

The graphene pattern 140 is disposed between the source electrode SE1 and the semiconductor layer 130 and between the drain electrode DE1 and the semiconductor layer 130 so that an electrical stability and a reliability of the TFT TR1 may be improved.

The TFT TR1 may further include a second graphene pattern 160 disposed on the source electrode SE1 and the drain electrode DE1 and a passivation layer 170 disposed on the second graphene pattern 160. The passivation layer 170 may be disposed in an entire area of the base substrate 110.

For example, the passivation layer 170 may include a silicon oxide (SiOx) and/or a silicon nitride (SiNx).

The passivation layer 170 may have a single layer structure. Alternatively, the passivation layer 170 may have a multi layer structure. For example, the passivation layer 170 may include a first layer disposed on the second graphene pattern 160 and a second layer disposed on the first layer. The first layer may include the silicon oxide (SiOx). The second layer may include the silicon nitride (SiNx).

When the passivation layer 170 makes direct contact with the source electrode SE1 and the drain electrode DE1, the passivation layer 170 may be lifted off from the source electrode SE1 and the drain electrode DE1 due to an interfacial reaction between the passivation layer 170 and the source electrode SE1 and the drain electrode DE1. For example, when the source electrode SE1 and the drain electrode DE1 includes copper (Cu) and the passivation layer includes a silicon oxide (SiOx), the copper (Cu) and the silicon oxide (SiOx) react with each other. Thus, a copper oxide (CuOx) is generated, and the passivation layer may be lifted off from the source electrode SE1 and the drain electrode DE1.

A portion of the second graphene pattern 160 is disposed between the source electrode SE1 and the passivation layer 170 to prevent an interfacial reaction between the source electrode SE1 and the passivation layer 170. Another portion of the second graphene pattern 160 is disposed between the drain electrode DE1 and the passivation layer 170 to prevent an interfacial reaction between the drain electrode DE1 and the passivation layer 170.

The second graphene pattern 160 is disposed between the source electrode SE1 and the passivation layer 170 and between the drain electrode DE1 and the passivation layer 170 so that a productivity and a reliability of the TFT TR1 may be improved.

When the semiconductor layer 130 includes an oxide semiconductor and the passivation layer 170 includes a silicon oxide (SiOx), the passivation layer is not lifted off from the source electrode SE1 and the drain electrode DE1 due to the second graphene pattern 160. Thus, an etch stopper protecting the oxide semiconductor may be omitted. Therefore, a process of manufacturing the TFT TR1 may be simplified and a manufacturing cost of the TFT TR1 may be decreased.

A contact hole CNT is formed through the passivation layer 170. The drain electrode DE1 is exposed through the contact hole CNT. The pixel electrode 180 is electrically connected to the drain electrode DE1 through the contact hole CNT. The pixel electrode 180 may include a transparent conductive material such as an indium tin oxide (ITO), an indium zinc oxide (IZO) and an aluminum doped zinc oxide (AZO).

FIGS. 3A to 3D are cross-sectional views illustrating a method of manufacturing the array substrate of FIG. 1.

Hereinafter, the method of manufacturing the array substrate may be explained in detail referring to FIGS. 3A to 3D.

Figure 3A:
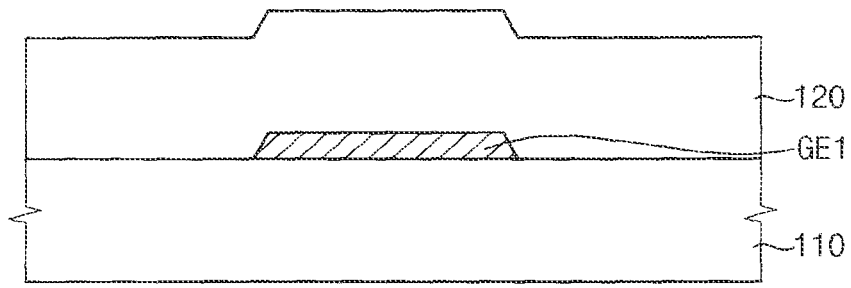
FIG. 3A, FIG. 3B, FIG. 3C, FIG. 3D, and FIG. 3E are cross-sectional views illustrating an exemplary embodiment of a method of manufacturing the array substrate of FIG. 1.

Referring to FIG. 3A, a gate electrode layer is formed on the base substrate 110. The gate electrode GE1 is formed by patterning the gate electrode layer. The gate electrode layer may be patterned by a photo lithography method. The gate electrode layer may be patterned using a first mask.

The gate insulating layer 120 is formed on the gate electrode GE1. The gate insulating layer 120 may have an upper surface having a protruding portion corresponding to the gate electrode GE1. Alternatively, the gate insulating layer 120 may have a planar upper surface.

Figure 3B:
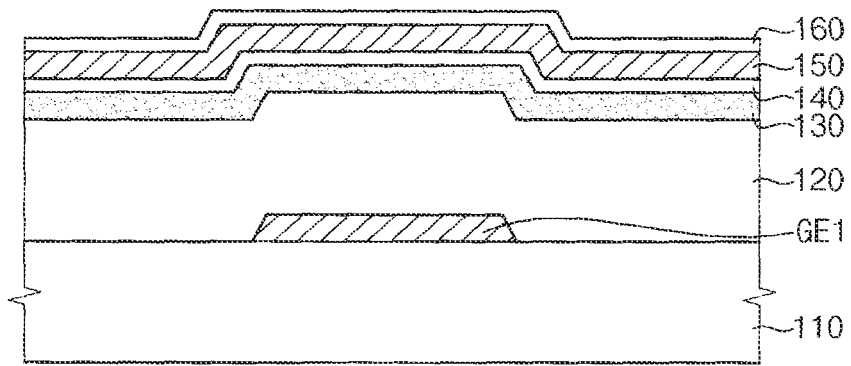

Referring to FIG. 3B, the semiconductor layer 130 is formed on the gate insulating layer 120. A graphene layer 140 is formed on the semiconductor layer 130. A source-drain electrode layer 150 is formed on the graphene layer 140. A second graphene layer 160 is formed on the source-drain electrode layer 150. The second graphene layer 160 may be omitted according to whether the source-drain electrode layer 150 reacts with the passivation layer 170.

The graphene layer 140 may be directly deposited on the semiconductor layer 130. For example, the graphene of the graphene layer 140 may be directly grown on the semiconductor layer 130. When the graphene is directly grown on the semiconductor layer 130, the graphene should be grown in a relatively low temperature to prevent damage to elements on the array substrate. For example, the graphene may be grown in a temperature under 400 degrees Celsius.

The graphene may be grown off of the array substrate and be transferred on the semiconductor layer 130 to form the graphene layer 140. When the graphene is grown off of the array substrate, the graphene may be grown at a relatively high temperature. Thus, a quality of the graphene layer 140 may be improved. For example, the graphene may be grown at a temperature of about 1000 degrees Celsius.

Like the graphene layer 140, the second graphene layer 160 may be directly grown on the source-drain electrode layer 150. The graphene of the second graphene layer 160 may be grown off of the array substrate and be transferred on the source-drain electrode layer 150 to form the second graphene layer 160.

Figure 3C:
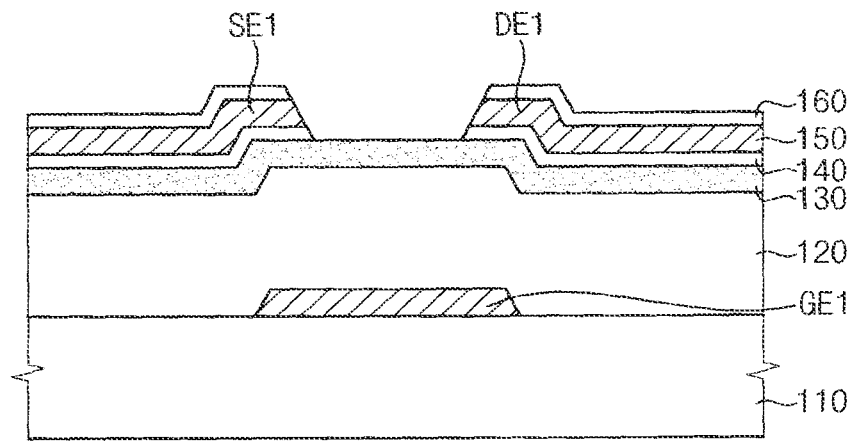

Referring to FIG. 3C, the second graphene layer 160, the source-drain electrode layer 150 and the graphene layer 140 are sequentially patterned so that the second graphene pattern 160, the source electrode SE1, the drain electrode DE1 and the graphene pattern 140 are formed.

The second graphene layer 160, the source-drain electrode layer 150 and the graphene layer 140 may be patterned using a second mask. The semiconductor layer 130 may be patterned using the second mask. Alternatively, the semiconductor layer 130 may be patterned using an additional mask prior to a second mask process.

A portion of the second graphene layer 160 may be ashed by an oxygen plasma ashing method to form the second graphene pattern 160. A portion of the second graphene layer 160 between the source electrode SE1 and the drain electrode DE1 may be removed.

A portion of the source-drain electrode layer 150 is etched to form the source electrode SE1 and the drain electrode DE1. The source-drain electrode layer 150 may be etched by a dry etching method. The source-drain electrode layer 150 may be etched by a wet etching method.

A portion of the graphene layer 140 may be ashed by the oxygen plasma ashing method to form the graphene pattern 140. A portion of the graphene layer 140 between the source electrode SE1 and the drain electrode DE1 may be removed.

The graphene layer 140 and the source-drain electrode layer 150 have different etching characteristics. Thus, when the source-drain electrode layer 150 is etched, the graphene layer 140 is not easily damaged. Accordingly, although the source-drain electrode layer 150 is etched for a long time, the semiconductor layer 130 may be protected by the graphene layer 140. In addition, the graphene layer 140 is removed by the oxygen plasma ashing in a short time so that the semiconductor layer 130 may not be damaged.

In the present exemplary embodiment, the second graphene layer 160 is deposited or transferred in an entire area of the source-drain electrode layer 150, and then a portion of the second graphene layer 160 is ashed to form the second graphene pattern 160. Accordingly, the second graphene pattern 160 covers an upper surface of the source electrode SE1 and an upper surface of the drain electrode DE1.

Alternatively, the source-drain electrode layer 150 is etched to form the source electrode SE1 and the drain electrode DE1, and then graphene may be selectively grown on the source electrode SE1 and the drain electrode DE1 to form the second graphene pattern 160. Accordingly, the second graphene pattern 160 may cover an upper surface and a side surface of the source electrode SE1 and an upper surface and a side surface of the drain electrode DE1, as shown in FIG. 3E.

Figure 3D:
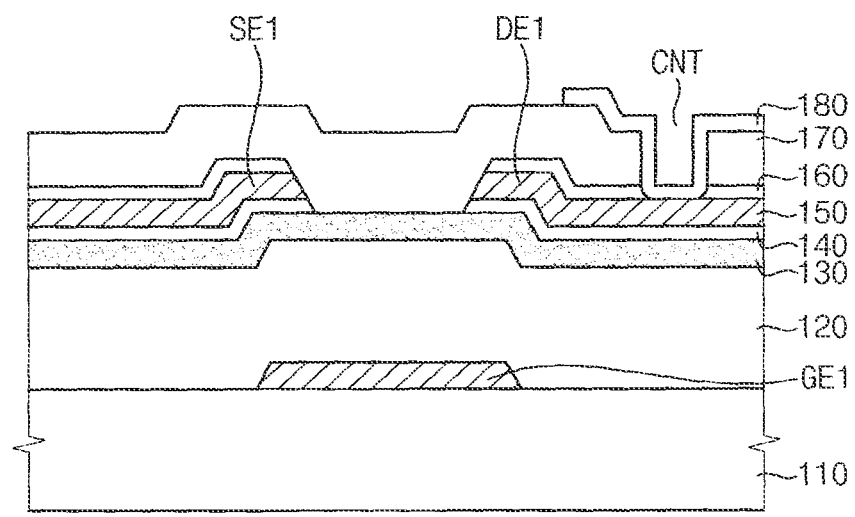
Figure 3E:
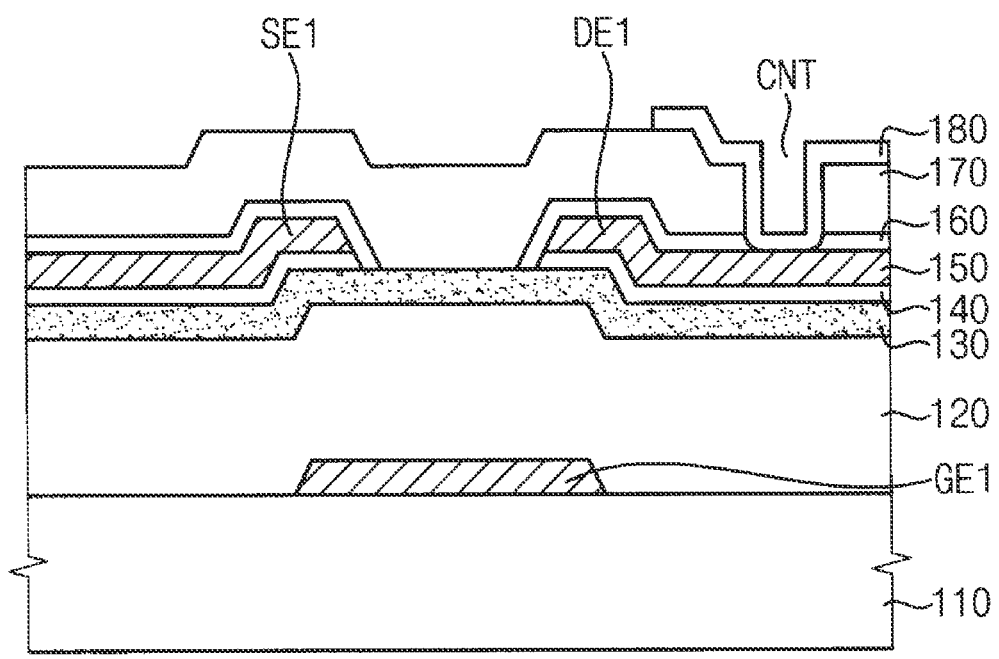

Referring to FIG. 3D, the passivation layer 170 is formed on the second graphene pattern 160 and the semiconductor layer 130. The contact hole CNT is formed through the passivation layer 170. The contact hole CNT may be formed using a third mask. The drain electrode DE1 is exposed through the contact hole CNT.

The pixel electrode 180 is formed on the passivation layer 170. The pixel electrode 180 may be formed using a fourth mask. The pixel electrode 180 makes contact with the drain electrode DE1 through the contact hole CNT.

According to the present exemplary embodiment, the graphene pattern 140 is disposed between the source electrode SE1 and the semiconductor layer 130 and between the drain electrode DE1 and the semiconductor layer 130 so that an electrical stability and a reliability of the TFT TR1 may be improved.

In addition, the second graphene pattern 160 is formed between the source electrode SE1 and the passivation layer 170 and between the drain electrode DE1 and the passivation layer 170 so that a productivity and a reliability of the TFT TR1 may be improved.

In addition, when the semiconductor 130 includes an oxide semiconductor, an etch stopper protecting the oxide semiconductor may be omitted so that a process of manufacturing the TFT TR1 may be simplified and a manufacturing cost of the TFT TR1 may be decreased.

In addition, when the source-drain electrode layer 150 and the graphene layer 140 are patterned, the semiconductor layer 130 may not be damaged.

Figure 4:
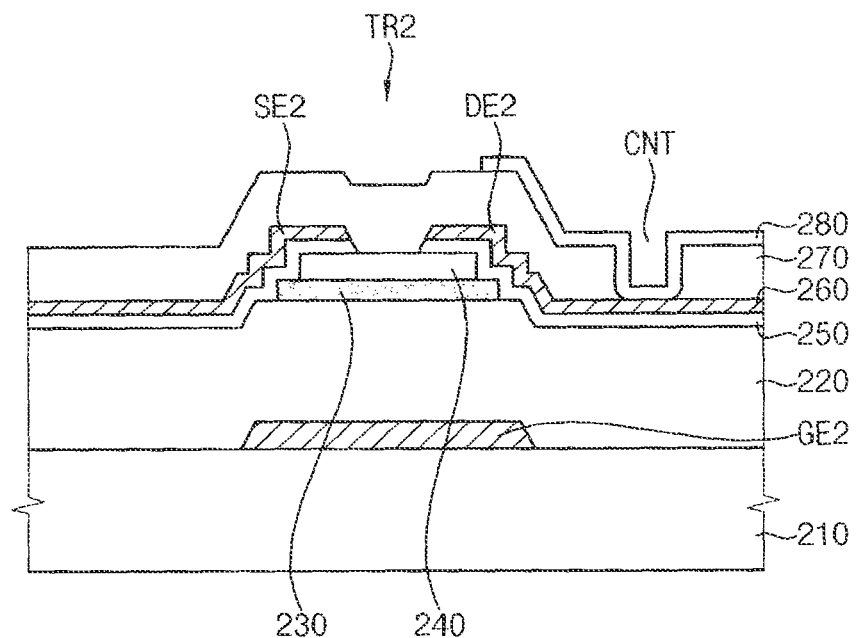
FIG. 4 is a cross-sectional view of an array substrate according to another exemplary embodiment of the present invention.

FIG. 4 is a cross-sectional view of an array substrate according to another exemplary embodiment of the present invention.

The array substrate of the present exemplary embodiment is substantially the same as the array substrate in FIGS. 1 to 3D except that the array substrate further includes an etch stopper protecting a semiconductor layer. Thus, any repetitive explanation concerning the same or like parts as those described in FIGS. 1 to 3D above will be omitted.

Referring to FIG. 4, a TFT TR2 includes a gate electrode GE2, a gate insulating layer 220, a semiconductor layer 230, an etch stopper 240, a graphene pattern 250, a source electrode SE2 and a drain electrode DE2.

The gate electrode GE2 is disposed on a base substrate 210. For example, the gate electrode GE2 may include a metal, an alloy or a transparent conductive material.

The gate electrode GE2 may have a single layer structure. Alternatively, the gate electrode GE2 may have a multi layer structure which includes a plurality of conductive layers or at least one of conductive layers and at least one of insulating layers.

The gate insulating layer 220 is disposed on the gate electrode GE2. The gate insulating layer 220 insulates the gate electrode GE2 from the semiconductor layer 230.

For example, the gate insulating layer 220 may include a silicon oxide (SiOx) and/or a silicon nitride (SiNx).

The gate insulating layer 220 may include a first layer disposed on the gate electrode GE2 and a second layer disposed on the first layer. The first layer may include the silicon nitride (SiNx). The second layer may include the silicon oxide (SiOx).

The semiconductor layer 230 is disposed on the gate insulating layer 220. The semiconductor layer 230 overlaps with the gate electrode GE2. The semiconductor layer 230 functions as a channel layer of the TFT TR2.

In the present exemplary embodiment, the semiconductor layer 230 includes an oxide semiconductor. For example, the semiconductor layer 230 may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide and so on.

The etch stopper 240 is disposed on the semiconductor layer 230. The etch stopper overlaps with a portion of the semiconductor layer 230 corresponding to an area between the source electrode SE2 and the drain electrode DE2.

The etch stopper 240 prevents the oxide semiconductor from making contact with the passivation layer 270 so that a characteristic of the oxide semiconductor is not changed. The etch stopper 240 includes a silicon oxide (SiOx). The etch stopper 240 may have a single layer structure or a multi layer structure.

The graphene pattern 250 is disposed on the semiconductor layer 230 and the etch stopper 240. The source electrode SE2 and the drain electrode DE2 are disposed on the graphene pattern 250.

The source electrode SE2 overlaps with the semiconductor layer 230. The drain electrode DE2 overlaps with the semiconductor layer 230. The drain electrode DE2 is spaced apart from the source electrode SE2.

For example, each of the source electrode SE2 and the drain electrode DE2 may include aluminum (Al), copper (Cu), molybdenum (Mo), titanium (Ti) and so on, or an alloy thereof. Each of the source electrode SE2 and the drain electrode DE2 may include a transparent conductive material such as an indium tin oxide (ITO), an indium zinc oxide (IZO) and an aluminum doped zinc oxide (AZO).

Each of the source electrode SE2 and the drain electrode DE2 may include a plurality of layers. Each of the source electrode SE2 and the drain electrode DE2 may include a first electrode layer making contact with the graphene pattern 250 and a second electrode layer making contact with the first electrode layer. For example, the first electrode layer may include one of titanium (Ti), molybdenum (Mo) and an alloy thereof. The second electrode layer may include copper (Cu).

A portion of the graphene pattern 250 is disposed between the source electrode SE2 and the semiconductor layer 230 to prevent an interfacial reaction between the source electrode SE2 and the semiconductor layer 230. Another portion of the graphene pattern 250 is disposed between the drain electrode DE2 and the semiconductor layer 230 to prevent an interfacial reaction between the drain electrode DE2 and the semiconductor layer 230. Accordingly, an electrical stability and a reliability of the TFT TR2 may be improved.

The TFT TR2 may further include a passivation layer 270 disposed on the source electrode SE2 and the drain electrode DE2. The passivation layer 270 may be disposed in an entire area of the base substrate 210.

For example, the passivation layer 270 may include a silicon nitride (SiNx). The passivation layer 270 may have a single layer structure or a multi layer structure.

A contact hole CNT is formed through the passivation layer 270. The drain electrode DE2 is exposed through the contact hole CNT. A pixel electrode 280 is electrically connected to the drain electrode DE2 through the contact hole CNT. The pixel electrode 280 may include a transparent conductive material such as an indium tin oxide (ITO), an indium zinc oxide (IZO) and an aluminum doped zinc oxide (AZO).

FIGS. 5A to 5E are cross-sectional views illustrating a method of manufacturing the array substrate of FIG. 4.

Hereinafter, the method of manufacturing the array substrate may be explained in detail referring to FIGS. 5A to 5E.

Figure 5A:
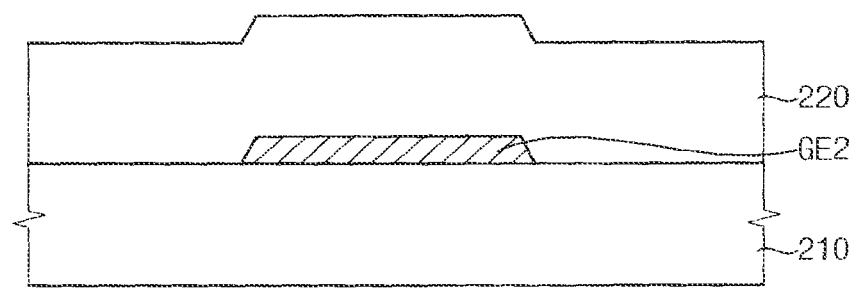
FIG. 5A, FIG. 5B, FIG. 5C, FIG. 5D, and FIG. 5E are cross-sectional views illustrating a method of manufacturing the array substrate of FIG. 4.

Referring to FIG. 5A, a gate electrode layer is formed on the base substrate 210. The gate electrode GE2 is formed by patterning the gate electrode layer. The gate electrode layer may be patterned by a photo lithography method. The gate electrode layer may be patterned using a first mask.

The gate insulating layer 220 is formed on the gate electrode GE2.

Figure 5B:
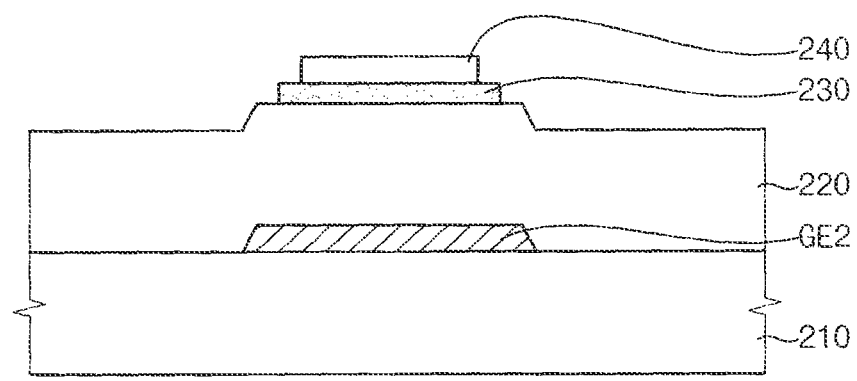

Referring to FIG. 5B, the semiconductor layer 230 is formed on the gate insulating layer 220. The etch stopper 240 is formed on the semiconductor layer 230. The semiconductor layer 230 may be patterned using a second mask. The etch stopper 240 may be formed using a third mask.

Figure 5C:
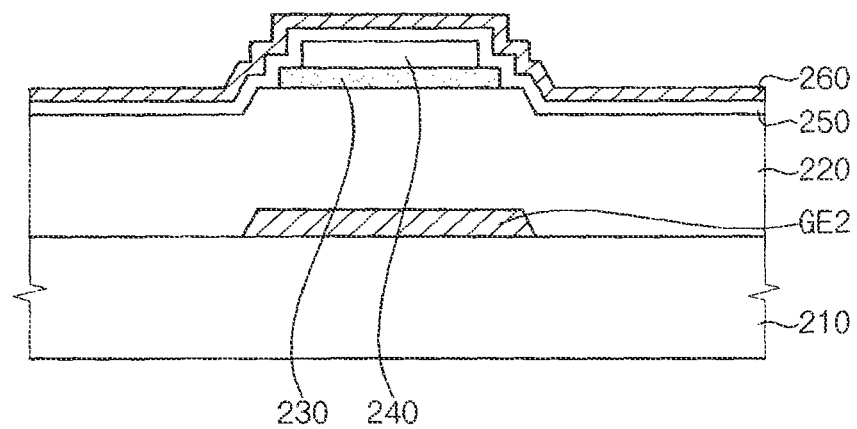

Referring to FIG. 5C, a graphene layer 250 is formed on the semiconductor layer 230 and the etch stopper 240. A source-drain electrode layer 260 is formed on the graphene layer 250.

The graphene layer 250 may be directly deposited on the semiconductor layer 230 and the etch stopper 240. For example, a graphene of the graphene layer 250 may be directly grown on the semiconductor layer 230 and the etch stopper 240.

The graphene may be grown off of the array substrate and be transferred on the semiconductor layer 230 and the etch stopper 240 to form the graphene layer 250.

Figure 5D:
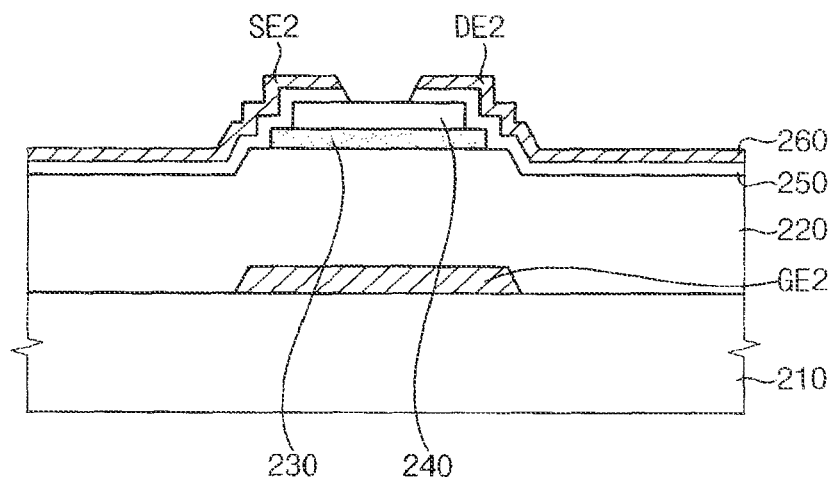

Referring to FIG. 5D, the source-drain electrode layer 260 and the graphene layer 250 are sequentially patterned so that the source electrode SE2, the drain electrode DE2 and the graphene pattern 250 are formed.

The source-drain electrode layer 260 and the graphene layer 250 may be patterned using a fourth mask.

A portion of the source-drain electrode layer 260 is etched to form the source electrode SE2 and the drain electrode DE2. The source-drain electrode layer 260 may be etched by a dry etching method. The source-drain electrode layer 260 may be etched by a wet etching method.

A portion of the graphene layer 250 may be ashed by the oxygen plasma ashing method to form the graphene pattern 250. A portion of the graphene layer 250 between the source electrode SE2 and the drain electrode DE2 may be removed.

The graphene layer 250 and the source-drain electrode layer 260 have different etching characteristics. Thus, when the source-drain electrode layer 260 is etched, the graphene layer 250 is not easily damaged. Accordingly, although the source-drain electrode layer 260 is etched for a long time, the semiconductor layer 230 may be protected by the graphene layer 250.

In addition, the graphene layer 250 is removed by the oxygen plasma ashing in a short time so that the semiconductor layer 230 may not be damaged.

Figure 5E:
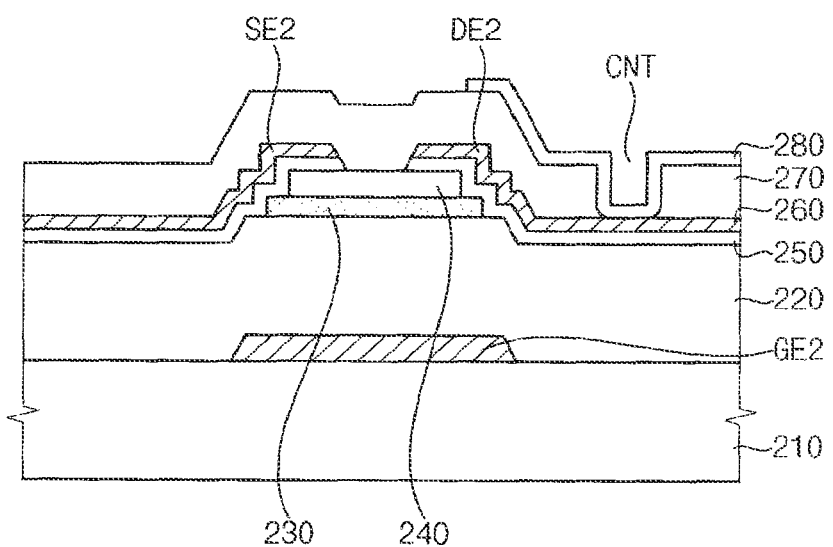

Referring to FIG. 5E, the passivation layer 270 is formed on the source electrode SE2, the drain electrode DE2 and the etch stopper 240. The contact hole CNT is formed through the passivation layer 270. The contact hole CNT may be formed using a fifth mask. The drain electrode DE2 is exposed through the contact hole CNT.

The pixel electrode 280 is formed on the passivation layer 270. The pixel electrode 280 may be formed using a sixth mask. The pixel electrode 280 makes contact with the drain electrode DE2 through the contact hole CNT.

According to the present exemplary embodiment, the graphene pattern 250 is disposed between the source electrode SE2 and the semiconductor layer 230 and between the drain electrode DE2 and the semiconductor layer 230 so that an electrical stability and a reliability of the TFT TR2 may be improved.

In addition, when the source-drain electrode layer 260 and the graphene layer 250 are patterned, the semiconductor layer 230 may not be damaged.

Figure 6:
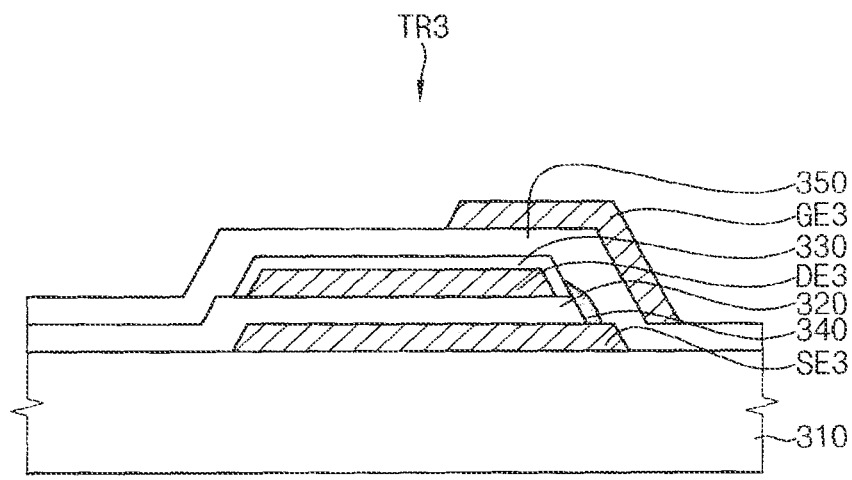
FIG. 6 is a cross-sectional view of an array substrate according to still another exemplary embodiment of the present invention.
Figure 7:
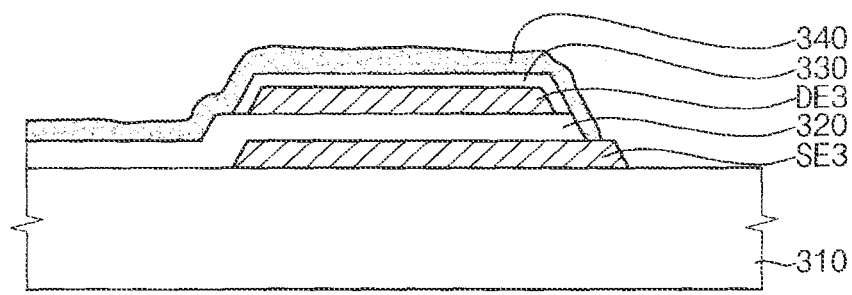
FIG. 7 is a cross-sectional view illustrating a method of manufacturing the array substrate of FIG. 6.

FIG. 6 is a cross-sectional view of an array substrate according to still another exemplary embodiment of the present invention. FIG. 7 is a cross-sectional view illustrating a method of manufacturing the array substrate of FIG. 6.

The array substrate of the present exemplary embodiment is substantially the same as the array substrate in FIGS. 1 to 3D, except that the array substrate includes a vertical TFT including a semiconductor layer disposed in a vertical direction. Thus, any repetitive explanation concerning the same or like parts as those described in FIGS. 1 to 3D above elements will be omitted.

Referring to FIGS. 6-7, a TFT TR3 includes a source electrode SE3, an insulating layer 320, a drain electrode DE3, a graphene pattern 330, a semiconductor layer 340, a gate insulating layer 350 and a gate electrode GE3.

The source electrode SE3 is disposed on a base substrate 310. The source electrode SE3 overlaps with the semiconductor layer 340.

For example, the source electrode SE3 may include one of aluminum (Al), copper (Cu), molybdenum (Mo) and titanium Ti or an alloy thereof. For example, the source electrode SE3 may include a transparent conductive material such as an indium tin oxide (ITO), an indium zinc oxide (IZO) or an aluminum doped zinc oxide (AZO).

The source electrode SE3 may have a single layer structure. Alternatively, the source electrode SE3 may have a multi layer structure which includes a plurality of conductive layers or at least one of conductive layers and at least one of insulating layers.

The insulating layer 320 is disposed on the source electrode SE3. The insulating layer 320 insulates the source electrode SE3 from the drain electrode DE3.

For example, the insulating layer 320 may include a silicon oxide (SiOx). For example, the insulating layer 320 may include a silicon nitride (SiNx). The insulating layer 320 may have a single layer structure or a multi layer structure.

The drain electrode DE3 is disposed on the insulating layer 320. The drain electrode DE3 overlaps with the semiconductor layer 340. The drain electrode DE3 is spaced apart from the source electrode SE3.

For example, the drain electrode DE3 may include one of aluminum (Al), copper (Cu), molybdenum (Mo) and titanium Ti or an alloy thereof. For example, the drain electrode DE3 may include a transparent conductive material such as an indium tin oxide (ITO), an indium zinc oxide (IZO) or an aluminum doped zinc oxide (AZO).

The drain electrode DE3 may have a single layer structure. Alternatively, the drain electrode DE3 may have a multi layer structure which includes a plurality of conductive layers or at least one of conductive layers and at least one of insulating layers.

The drain electrode DE3 may include a plurality of electrode layers. The drain electrode DE3 may include a first electrode layer making contact with the graphene pattern 330 and a second electrode layer making contact with the first electrode layer. For example, the first electrode layer may include one of titanium (Ti), molybdenum (Mo) and an alloy thereof. The second electrode layer may include copper (Cu).

The graphene pattern 330 is disposed on the drain electrode DE3. The graphene pattern 330 covers an upper surface and a side surface of the drain electrode DE3. A portion of the semiconductor layer 340 corresponding to the upper surface of the drain electrode DE3 is etched. In contrast, a portion of the semiconductor layer 340 corresponding to the side surface of the drain electrode DE3 remains. Accordingly, a portion of the graphene pattern 330 is disposed between the drain electrode DE3 and the semiconductor layer 340. Another portion of the graphene pattern 330 is disposed between the drain electrode DE3 and the gate insulating layer 350.

Therefore, the semiconductor layer 340 extends in a vertical direction according to a side surface of the insulating layer 320 to connect the source electrode SE3 to the drain electrode DE3. The semiconductor layer 340 functions as a channel layer of the TFT TR3. The semiconductor layer 340 may include an amorphous silicon semiconductor. The semiconductor layer 340 may include an oxide semiconductor.

Referring to FIGS. 6 and 7, the semiconductor layer 340 entirely overlaps with the drain electrode DE3 in a process of manufacturing the semiconductor layer 340.

When the semiconductor layer 340 makes direct contact with the drain electrode DE3, a characteristic of the semiconductor layer 340 is changed due to an interfacial reaction between the semiconductor layer 340 and the drain electrode DE3 so that an electrical stability and a reliability of the TFT TR3 may be decreased.

In addition, the semiconductor layer 340 may be lifted off from the drain electrode DE3 due to the interfacial reaction between the semiconductor layer 340 and the drain electrode DE3.

The graphene pattern 330 is disposed between the drain electrode DE3 and the semiconductor layer 340 in the process of manufacturing the semiconductor layer 340 so that the graphene pattern 330 prevents the interfacial reaction between the semiconductor layer 340 and the drain electrode DE3. Thus, an electrical stability and a reliability of the TFT TR3 may be improved. In addition, a productivity and a reliability of the TFT TR3 may be improved.

Referring again to FIG. 6, the gate insulating layer 350 is disposed on the graphene pattern 330 and the semiconductor layer 340. The gate insulating layer 350 insulates the gate electrode GE3 from the semiconductor layer 340.

For example, the gate insulating layer 350 may include a silicon oxide (SiOx). For example, the gate insulating layer 350 may include a silicon nitride (SiNx). The gate insulating layer 350 may have a single layer structure or a multi layer structure.

When the gate insulating layer 350 makes direct contact with the drain electrode DE3, the gate insulating layer 350 may be lifted off from the drain electrode DE3 due to an interfacial reaction between the drain electrode DE3 and the gate insulating layer 350.

A portion of the graphene 330 is disposed between the drain electrode DE3 and the gate insulating layer 350 to prevent the interfacial reaction between the drain electrode DE3 and the gate insulating layer 350. Thus, a productivity and a reliability of the TFT TR3 may be improved.

The gate electrode GE3 is disposed on the gate insulating layer 350. The gate electrode GE3 overlaps with the semiconductor layer 340.

For example, the gate electrode GE3 may include one of aluminum (Al), copper (Cu), molybdenum (Mo) and titanium Ti or an alloy thereof. For example, the gate electrode GE3 may include a transparent conductive material, such as an indium tin oxide (ITO), an indium zinc oxide (IZO) or an aluminum doped zinc oxide (AZO).

The gate electrode GE3 may have a single layer structure. Alternatively, the gate electrode GE3 may have a multi layer structure which includes a plurality of conductive layers or at least one of conductive layers and at least one of insulating layers.

When the insulating layer 320 makes direct contact with the source electrode SE3, the insulating layer 320 may be lifted off from the source electrode SE3 due to an interfacial reaction between the source electrode SE3 and the insulating layer 320.

When the drain electrode DE3 makes direct contact with the insulating layer 320, the drain electrode DE3 may be lifted off from the insulating layer 320 due to an interfacial reaction between the insulating layer 320 and the drain electrode DE3.

The second graphene pattern prevents the interfacial reaction between the source electrode SE3 and the insulating layer 320. The third graphene pattern prevents the interfacial reaction between the insulating layer 320 and the drain electrode DE3. Thus, a productivity and a reliability of the TFT TR3 may be improved.

Although not shown in the figures, when the semiconductor layer 340 includes an amorphous silicon semiconductor, an ohmic contact layer may be formed between the source electrode SE3 and the insulating layer 320 and between the insulating layer 320 and the drain electrode DE3. The ohmic contact layer may include an amorphous silicon doped with a dopant.

According to the present exemplary embodiment, the graphene pattern 330 is disposed between the drain electrode DE3 and the semiconductor layer 340 so that an electrical stability, a productivity and a reliability of the TFT TR3 may be improved.

In addition, the graphene pattern 330 is disposed between the drain electrode DE3 and the gate insulating layer 350 so that a productivity and a reliability of the TFT TR3 may be improved.

Figure 8:
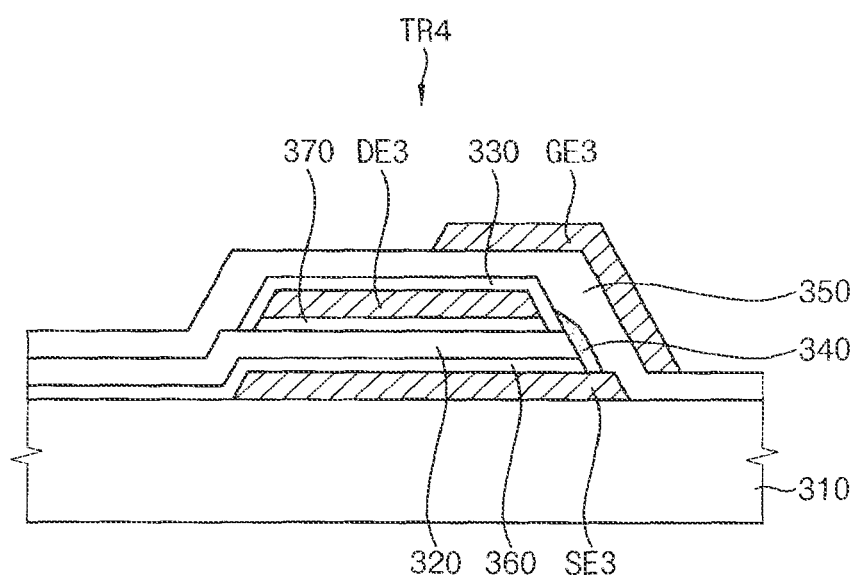
FIG. 8 is a cross-sectional view of an array substrate according to still another exemplary embodiment of the present invention.

FIG. 8 is a cross-sectional view of an array substrate according to still another exemplary embodiment of the present invention.

The array substrate of the present exemplary embodiment is substantially the same as the array substrate in FIGS. 6 and 7, except that the array substrate further includes a second graphene pattern and a third graphene pattern. Thus, any repetitive explanation concerning the same or like parts as those described in FIGS. 6 and 7 above elements will be omitted.

Referring to FIG. 8, a TFT TR4 includes a source electrode SE3, an insulating layer 320, a drain electrode DE3, a graphene pattern 330, a semiconductor layer 340, a gate insulating layer 350, a gate electrode GE3, a second graphene pattern 360 and a third graphene pattern 370.

The second graphene pattern 360 is disposed between the source electrode SE3 and the insulating layer 320. The third graphene pattern 370 is disposed between the drain electrode DE3 and the insulating layer 320.

According to the present exemplary embodiment, the graphene pattern 330 is disposed between the drain electrode DE3 and the semiconductor layer 340 so that an electrical stability, a productivity and a reliability of the TFT TR4 may be improved.

In addition, the graphene pattern 330 is disposed between the drain electrode DE3 and the gate insulating layer 350 so that a productivity and a reliability of the TFT TR4 may be improved.

In addition, the second and third graphene patterns 360 and 370 are respectively disposed between the source electrode SE3 and the insulating layer 320 and between the drain electrode DE3 and the insulating layer 320 so that a productivity and a reliability of the TFT TR4 may be improved.

According to the TFT and the method of manufacturing the TFT, the graphene pattern prevents at least one of the source electrode and the drain electrode from reacting with the semiconductor layer so that an electrical stability and a reliability of the TFT may be improved. In addition, the graphene pattern also prevents at least one of the source electrode and the drain electrode from reacting with the passivation layer so that a process of manufacturing the TFT may be simplified and a manufacturing cost of the TFT may be decreased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor ("TFT") comprising:
   a gate electrode;
   a semiconductor layer overlapping with the gate electrode;
   a first insulating layer disposed between the gate electrode and the semiconductor layer;
   a source electrode overlapping with the semiconductor layer;
   a drain electrode overlapping with the semiconductor layer and vertically spaced apart from the source electrode;
   a second insulating layer disposed between the source electrode and the drain electrode; and
   a first graphene pattern disposed between the semiconductor layer and at least one of the source electrode and the drain electrode,
   wherein the semiconductor layer does not extend beyond the topmost surface at least one of the source and drain electrodes.

2. The TFT of claim 1, wherein the first graphene pattern covers upper and side surfaces of at least one of the source and drain electrodes.

3. The TFT of claim 1, wherein a first portion of the first graphene pattern is disposed between the drain electrode and the semiconductor layer, and
   a second portion of the first graphene pattern is disposed between the drain electrode and the first insulating layer.

4. The TFT of claim 3, further comprising:
   a second graphene pattern disposed between the source electrode and the second insulating layer; and
   a third graphene pattern disposed between the drain electrode and the second insulating layer.

5. The TFT of claim 4, wherein the semiconductor layer contacts the first graphene pattern and the second graphene pattern.

6. The TFT of claim 1, wherein the second insulating layer covers a portion of the source electrode.

7. The TFT of claim 6, wherein the semiconductor layer contacts a lateral end of the second insulating layer.

8. The TFT of claim 1, wherein at least one of the source electrode and the drain electrode comprises a plurality of electrode layers.

9. The TFT of claim 1, wherein the semiconductor layer includes an oxide semiconductor.

10. A thin film transistor ("TFT") comprising:
    a gate electrode;
    a semiconductor layer overlapping with the gate electrode;
    a first insulating layer disposed between the gate electrode and the semiconductor layer;

a source electrode overlapping with the semiconductor layer;
a drain electrode overlapping with the semiconductor layer and vertically spaced apart from the source electrode;
a second insulating layer disposed between the source electrode and the drain electrode; and
a first graphene pattern disposed between the semiconductor layer and at least one of the source electrode and the drain electrode, wherein:

at least one of the source electrode and the drain electrode comprises a plurality of electrode layers;

at least one of the source electrode and the drain electrode comprises a first electrode layer making contact with the first graphene pattern and a second electrode layer making contact with the first electrode layer;

the first electrode layer comprises one of titanium (Ti), molybdenum (Mo) and an alloy thereof; and the second electrode layer comprises copper (Cu).

11. The TFT of claim 1, wherein the drain electrode is disposed between the gate electrode and the source electrode.

\* \* \* \* \*